(12) United States Patent
Chen et al.

(10) Patent No.: US 10,134,744 B1
(45) Date of Patent: Nov. 20, 2018

(54) SEMICONDUCTOR MEMORY DEVICE (71) Applicant: UNITED MICROELECTRONICS CORP., Hsin-Chu (TW)

(72) Inventors: Chih-Han Chen, Tainan (TW); Wei-Chi Chen, New Taipei (TW); Ching Chang, New Taipei (TW); Ming-Shing Chen, Kaohsiung (TW); Chao-Hsien Wu, Hsinchu (TW); Chia-Hui Hwang, Tainan (TW); Lu-Ran Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/681,444

(22) Filed: Aug. 21, 2017

(51) Int. Cl.
*G11C 11/404* (2006.01)
*H01L 27/11* (2006.01)
*H01L 27/12* (2006.01)
*G11C 11/4097* (2006.01)
*G11C 11/417* (2006.01)

(52) U.S. Cl.
CPC ........... *H01L 27/11* (2013.01); *G11C 11/404* (2013.01); *G11C 11/4097* (2013.01); *G11C 11/417* (2013.01); *H01L 27/1211* (2013.01)

(58) Field of Classification Search
CPC .............................. G11C 11/404; G11C 8/08
USPC .................................................. 365/174, 154
See application file for complete search history.

(56) References Cited

U.S. PATENT DOCUMENTS

| 7,404,154 | B1 | 7/2008 | Venkatraman et al. |
| 7,535,751 | B2 | 5/2009 | Huang et al. |
| 7,825,437 | B2 | 11/2010 | Pillarisetty |
| 8,009,463 | B2 | 8/2011 | Liaw |
| 8,675,397 | B2 | 3/2014 | Liaw |
| 8,908,421 | B2 | 12/2014 | Liaw |
| 2008/0019171 | A1* | 1/2008 | Liaw ............... G11C 11/412 365/174 |
| 2017/0148505 | A1* | 5/2017 | Kwon ............... H01L 27/11 |
| 2017/0194330 | A1* | 7/2017 | Lee ............... H01L 27/092 |
| 2017/0323894 | A1* | 11/2017 | Yeh ............... H01L 27/1104 |
| 2017/0365611 | A1* | 12/2017 | Kwon ............... H01L 23/528 |

OTHER PUBLICATIONS

Wang, Title of Invention: Layout Pattern for SRAM and Manufacturing Methods Thereof, U.S. Appl. No. 15/088,122, filed Apr. 1, 2016.

* cited by examiner

*Primary Examiner* — Michael Tran
(74) *Attorney, Agent, or Firm* — Winston Hsu (57) ABSTRACT

A semiconductor memory device includes a first inverter, a second inverter, a first and second inner access transistors, and a first and second outer access transistors. The first inverter includes a first pull-up transistor and a first pull-down transistor, the second inverter includes a second pull-up transistor (PL2) and a second pull-down transistor, and the first inverter and the second inverter forms a latch circuit. The first and second inner access transistors and the first and second outer access transistors are electrically connected to the latch circuit, and channel widths of the second inner access transistor and the second outer access transistor are different from each other.

18 Claims, 9 Drawing Sheets

SEMICONDUCTOR MEMORY DEVICE

BACKGROUND OF THE INVENTION

1. Field of the Invention

The invention relates to a semiconductor memory device, and more particularly, to a static random access memory (SRAM) device having the advantage of improving the inconsistent currents in different regions.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as pitch of the exposure process decreases, it has been difficult for the current SRAM architecture to produce desirable patterns. Hence, how to enhance the current SRAM architecture for improving exposure quality has become an important task in this field.

SUMMARY OF THE INVENTION

It is one of the primary objectives of the present invention to provide a semiconductor memory device having asymmetric two access transistors, so as to improve the inconsistent Iread and static noise margin (SNM) in different regions. In this way, the semiconductor memory device of the present invention may therefore obtain preferable quality and elemental performance.

To achieve the purpose described above, the present invention provides a semiconductor memory device including a first inverter, a second inverter, a first inner access transistor and a first outer access transistor, and a second inner access transistor and a second outer access transistor. The first inverter includes a first pull-up transistor and a first pull-down transistor. The second inverter includes a second pull-up transistor and a second pull-down transistor, with the first inverter and the second inverter forming a latch circuit. The first inner access transistor and the first outer access transistor are electrically connected to the latch circuit and a first word line, and the second inner access transistor and the second outer access transistor are electrically connected to the latch circuit and a second word line, wherein the second inner access transistor and the second outer access transistor have different channel widths.

Overall, a semiconductor memory device is provided to have asymmetric access transistors, to as to improve the aforementioned issues. Through the present invention, the performance of an outer access transistor is enhanced, and/or the performance of an inner transistor is reduced, either through changing the channel widths, the resistances or the threshold voltages thereof. That is, the currents passed through the outer access transistor and the inner access transistor may be enhance and/or reduced accordingly. In this way, the inconsistent currents in different regions are decreased, and the quality and the performance of semiconductor memory device can be improved thereby.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-2 illustrate schematic diagrams of a SRAM device according to a first preferred embodiment of the present invention; in which:

FIGS. 3-6 illustrate schematic diagrams of a semiconductor memory device according to a second preferred embodiment of the present invention, in which:

FIGS. 7-9 illustrate schematic diagrams of a semiconductor memory device according to a third preferred embodiment of the present invention, in which:

DETAILED DESCRIPTION

To provide a better understanding of the presented invention, preferred embodiments will be described in detail. The preferred embodiments of the present invention are illustrated in the accompanying drawings with numbered elements.

Figure 1:
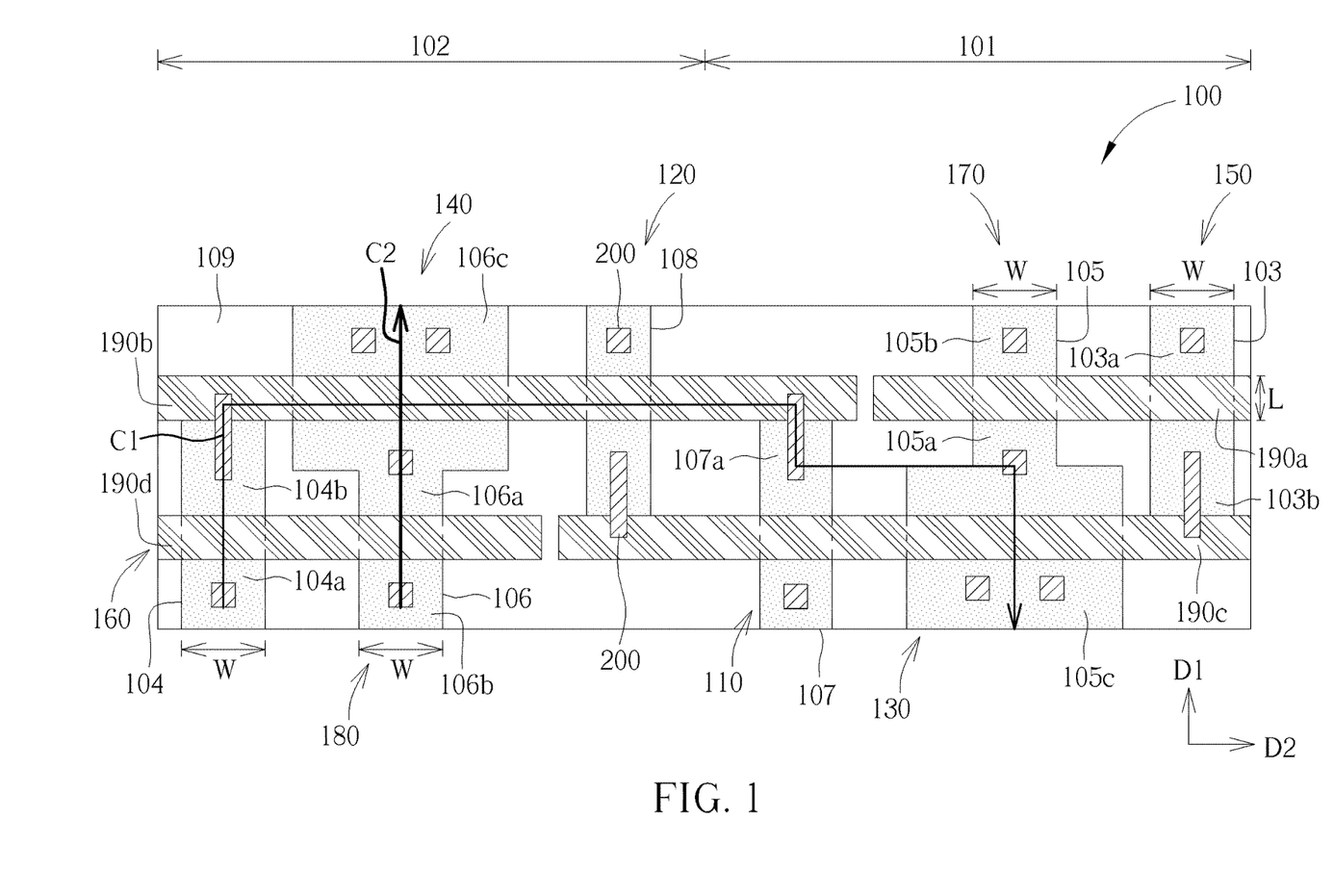
FIG. 1 shows a layout of a semiconductor memory device.
Figure 2:
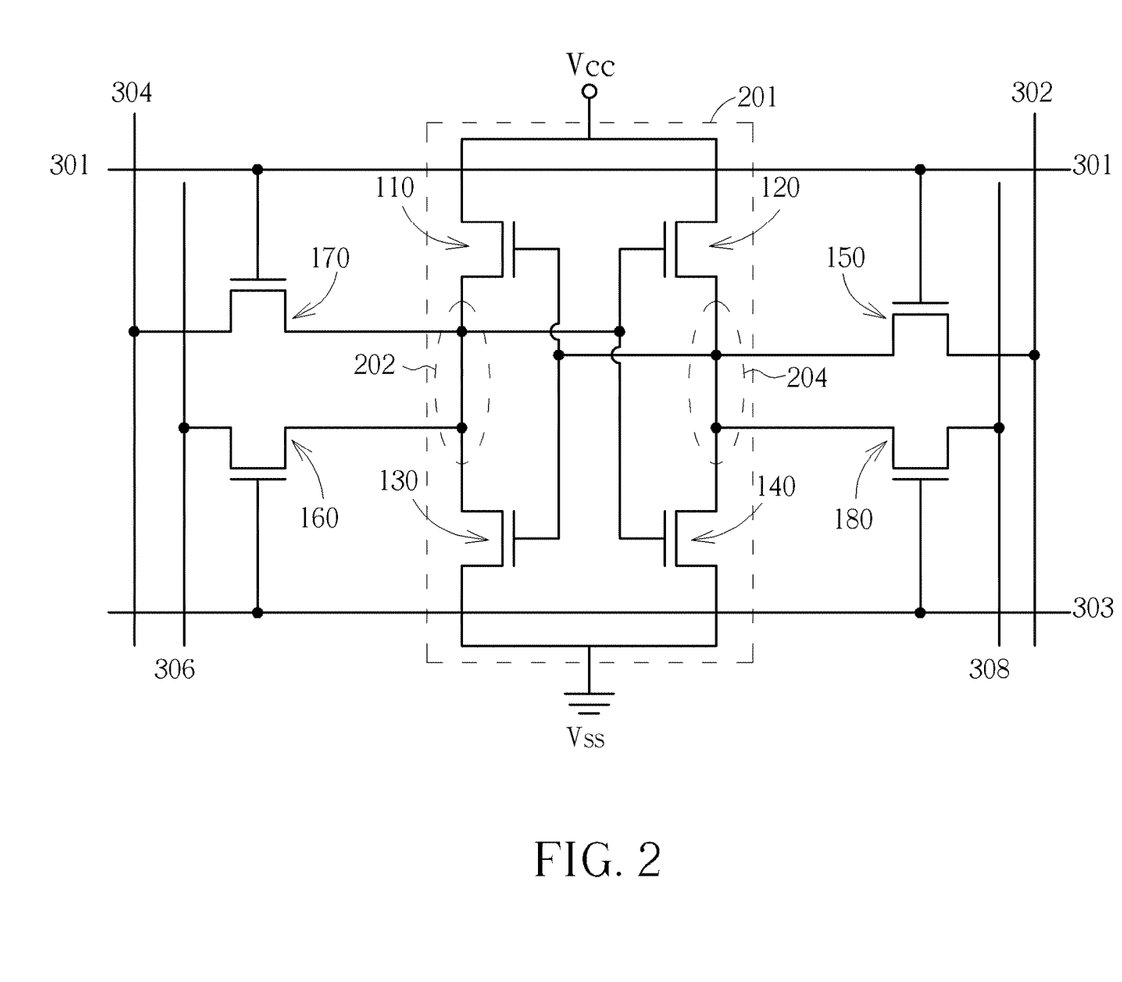
FIG. 2 shows a circuit diagram of the semiconductor memory device.

Please refer to FIG. 1 to FIG. 2, illustrating a semiconductor memory device 100, such as a static random access memory (SRAM) device, according to the first embodiment of the present invention. As shown in FIG. 1, a substrate (not shown in the drawings) such as a silicon substrate or a silicon on insulator (SOI) substrate is provided, and the substrate has a first region 101 and a second region 102 defined thereon. Also, a plurality of active areas 103, 104, 105, 106, 107, 108 parallel extended in a first direction D1, such as the y-direction, are formed on the substrate respectively, and the active areas 103, 104, 105, 106, 107, 108 are surrounded by a shallow trench isolation (STI) 109. Then, at least one gate is disposed on the substrate and crosses the active areas 103-108 in a second direction D2, such as the x-direction.

In the present embodiment, four gates 190a, 190b, 190c, 190d are parallel formed on the substrate, across the active areas 103-108 respectively, to define eight metal-oxide-semiconductor (MOS) transistors 110, 120, 130, 140, 150, 160, 170, 180. As shown in FIG. 1, the gate electrodes of the MOS transistors 110, 130, and the gate electrodes of the MOS transistors 150, 170 within the first region 101 are directly contacted with each other, respectively. Likewise, the gate electrodes of the MOS transistors 120, 140, and the gate electrodes of the MOS transistors 160, 180 within the second region 102 are directly contacted with each other, respectively. Also, the MOS transistors 130, 170 include a shared drain region 105a, and two source regions 105b, 105c disposed at two sides of the two gates 190a, 190c respectively. Equally, the MOS transistors 140, 180 also include a shared drain region 106a and two source regions 106c, 106b disposed at two sides of the two gates 190b, 190d. Besides, a plurality of plug structures 200 is disposed over each active area 103-108 and/or each gate 190a-d to electrically connect thereto. Through this arrangement, the eight MOS transistors 110, 120, 130, 140, 150, 160, 170, 180 may together serve as a smallest unit in the semiconductor memory device, such as an eight-transistor SRAM (8T-SRAM) device, therefore accepting signals from a bit line and a word line subsequent formed during the operation.

Precisely, each cell of the 8T-SRAM device includes the MOS transistors 110, 120 such as a p-type metal oxide semiconductor (PMOS) transistor respectively, to function like two pull-up (PL) transistors, the MOS transistors 130, 140 such as a n-type metal oxide semiconductor (NMOS) transistor respectively, to function like two pull-down (PD) transistors, the MOS transistors 150, 160, 170, 180 such as a NMOS transistor respectively, to function like two inner and two outer access (PG) transistors. That is, the eight MOS transistors 110, 120, 130, 140, 150, 160, 170, 180 constitute a set of flip-flops, with the first PL transistor (namely the MOS transistors 110) and the first PD transistor (namely the MOS transistor 130) preferably constituting a first inverter (not shown in the drawings), with the second PL transistor (namely the MOS transistors 120) and the second PD transistor (namely the MOS transistor 140) preferably constituting a second inverter (not shown in the drawings), and with the first inverter and the second inverter constituting a latch circuit 201 that stores data in the storage nodes 202 and 204, as shown in FIG. 2.

In addition, the storage node 202 is connected to the respective gate electrodes of the second PL transistor 120 and the second PD transistor 140, and is further connected to the drain regions of the first PD transistor 130, the first PL transistor 110, a second outer PG transistor 160 (namely the MOS transistor 160) and a first inner PG transistor 170 (namely the MOS transistor 170). Similarly, the storage node 204 is connected to the respective gate electrodes of the first PD transistor 130 and the first PL transistor 110, and is further connected to the drain regions of the second PD transistor 140, the second PL transistor 120, a first outer PG transistor 150 (namely the MOS transistor 150) and a second inner PG transistor 180 (namely the MOS transistor 180) as shown in FIGS. 1-2. Then, the gate electrodes of the first outer PG transistor 150 and the first inner PG transistor 170 are respectively coupled to a first word line 301, and the gate electrodes of the second outer PG transistor 160 and the second inner PG transistor 180 are respectively coupled to a second word line 303. On the other hand, the source region of the first outer PG transistor 150 is coupled to a first bit line 302, the source region of the first inner PG transistor 170 is coupled to a second bit line 304, the source region of the second outer PG transistor 160 is coupled to a third bit line 306, and the source region of the second inner PG transistor 180 is coupled to a fourth bit line 308.

According to the present embodiment, the semiconductor memory device 100 is obtained to have a symmetric layout. As shown in FIG. 1, each gates 190a-d, each active areas 103-108 and each plug structures 200 disposed in the first region 101 and the second region 102 are actually symmetric arranged from one another. Furthermore, the first outer PG transistor 150 and the first inner PG transistor 170 disposed in the first region 101, and the second outer PG transistor 160 and second inner PG transistor 180 disposed in the second region 102 are preferably in a symmetric layout respectively. For example, in one embodiment, the first outer PG transistor 150 and the first inner PG transistor 170, as well as the second outer PG transistor 160 and second inner PG transistor 180, preferably include the same channel width W (referring to a width of the overlapping area between the gate 190a/190d and the active area 103, 105/104, 106) and the same channel length L (referring to a length of the overlapping area between the gate 190a/190d and the active area 103, 105/104, 106), as shown in FIG. 1. Namely, a ratio of the channel width (W:W) and/or a ratio of the channel length (L:L) between the first outer PG transistor 150 and the first inner PG transistor 170, or between the second outer PG transistor 160 and second inner PG transistor 180, is about 1:1. In this way, the semiconductor memory device with aforementioned symmetric layout may also obtain a symmetric current path, so as to improve the entire performance of the semiconductor memory device.

However, during the practical operation of the semiconductor memory device in the aforementioned embodiment, one current path C1 may pass from the third bit line 306 to a voltage source (Vss) via the source/drain regions 104a, 104b of the second outer PG transistor 160, the gate electrode of the second PD transistor 140, the gate electrode of the second PL transistor 120, the drain region 107a of the first PL transistor 110, and the drain shared drain region 105a, and the source region 105c of the first PD transistor 130 sequentially, and another current path C2 may pass from the fourth bit line 308 to the voltage source via the source region 106b of the second inner PG transistor 180, the shared drain region 106a of the second inner PG transistor 180 and the second PD transistor 140, and the source region 106c of the second PD transistor 140. It is noted that, since the resistance of the current path C1 is obvious greater than the resistance of the current path C2, the inconsistent Iread and static noise margin (SNM) are found in different regions. For example, in a 28 nanometers (nm) 8TDP-SRAM, the current that passes through the outer PG transistor 150 (the current that passes from the source region 103a to the drain region 103b thereof) is about 10%-14% lower than that passes through the first inner PG transistor 170. Thus, the operation of the semiconductor memory device in the present embodiment may be influenced accordingly.

The following description will detail the different embodiments of a semiconductor memory device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIGS. 3-6, a semiconductor memory device according to the second embodiment of the present invention is shown. The layout of the semiconductor memory device in the present embodiment is substantially similar to that in aforementioned first embodiment, and which includes four gates across six active areas to define eight transistors to serve as a cell of 8T-SRAM device. The difference between the present embodiment and the aforementioned first preferred embodiment is in that, an asymmetric first outer PG transistor 450 and first inner PG transistor 470, and/or an asymmetric second outer PG transistor 460 and second inner PG transistor 480, are provided.

Figure 3:
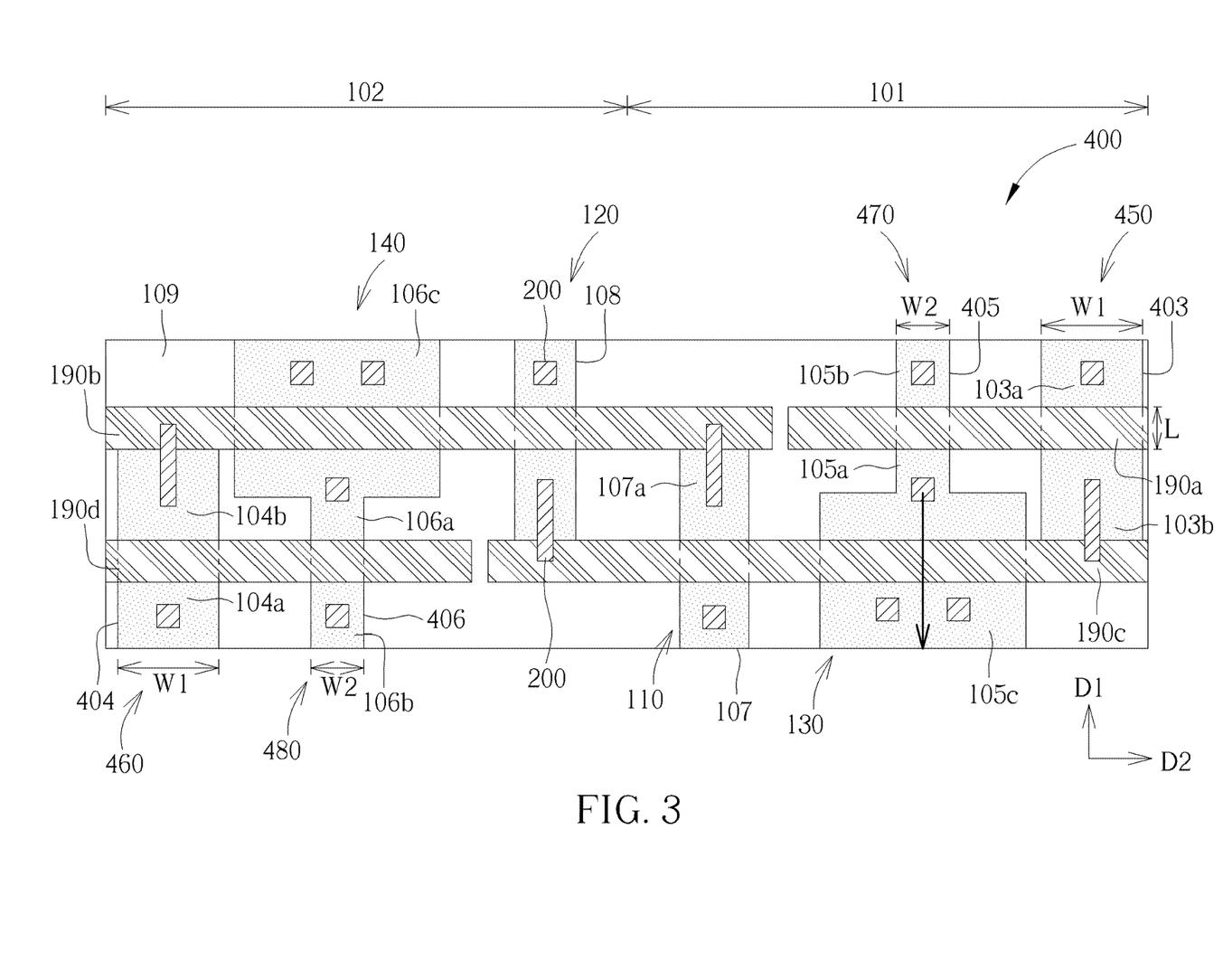
FIG. 3 shows a layout of a semiconductor memory device.

Precisely speaking, the asymmetric first outer PG transistor 450 and first inner PG transistor 470, and/or the asymmetric second outer PG transistor 460 and second inner PG transistor 480 of the present embodiment preferably include different channel widths W1, W2. For example, the active areas 403-406 are both disposed on a planar substrate (not shown in the drawings), and the widths of the active area 403 and/or the active area 405 disposed below the gate 190*a* within the first region 101 are changed for example through an optical proximity correction (OPC) process. That is, the channel widths W1 of the first outer PG transistor 450 is therefore enlarged and the channel width W2 of the first inner PG transistor 470 is therefore reduced, in comparison with the channel widths W of the first embodiment, as shown in FIG. 3. In one embodiment, a ratio between the channel widths (W1:W2) of the first outer PG transistor 450 and the first inner PG transistor 470 is about 2:1 to 4:1 but not limited thereto. Equality, the channel widths W1, W2 of the second outer PG transistor 460 and second inner PG transistor 480 may also be changed through the similar strategy above, as shown in FIG. 3.

Accordingly, the semiconductor memory device 400 obtained in the present embodiment may therefore have an asymmetric PG transistors layout rather in the first region 101 or in the second region 102. In this way, the channel width W1 of the first outer PG transistor 450 is greater than the channel width W2 of the first inner PG transistor 470, and/or the channel width W1 of the second outer PG transistor 460 is greater than the channel width W2 of the second inner PG transistor 480, so as to enhance the performance of the first outer PG transistor 450 and the second outer PG transistor 460, and also reduce the performance of the first inner PG transistor 470 and the second inner PG transistor 480. Thus, the inconsistent current issue between the inner PG transistor and the outer PG transistor in the first embodiment is therefore improved, and the semiconductor memory device 400 of the present embodiment can achieve better performance thereby.

Figure 4:
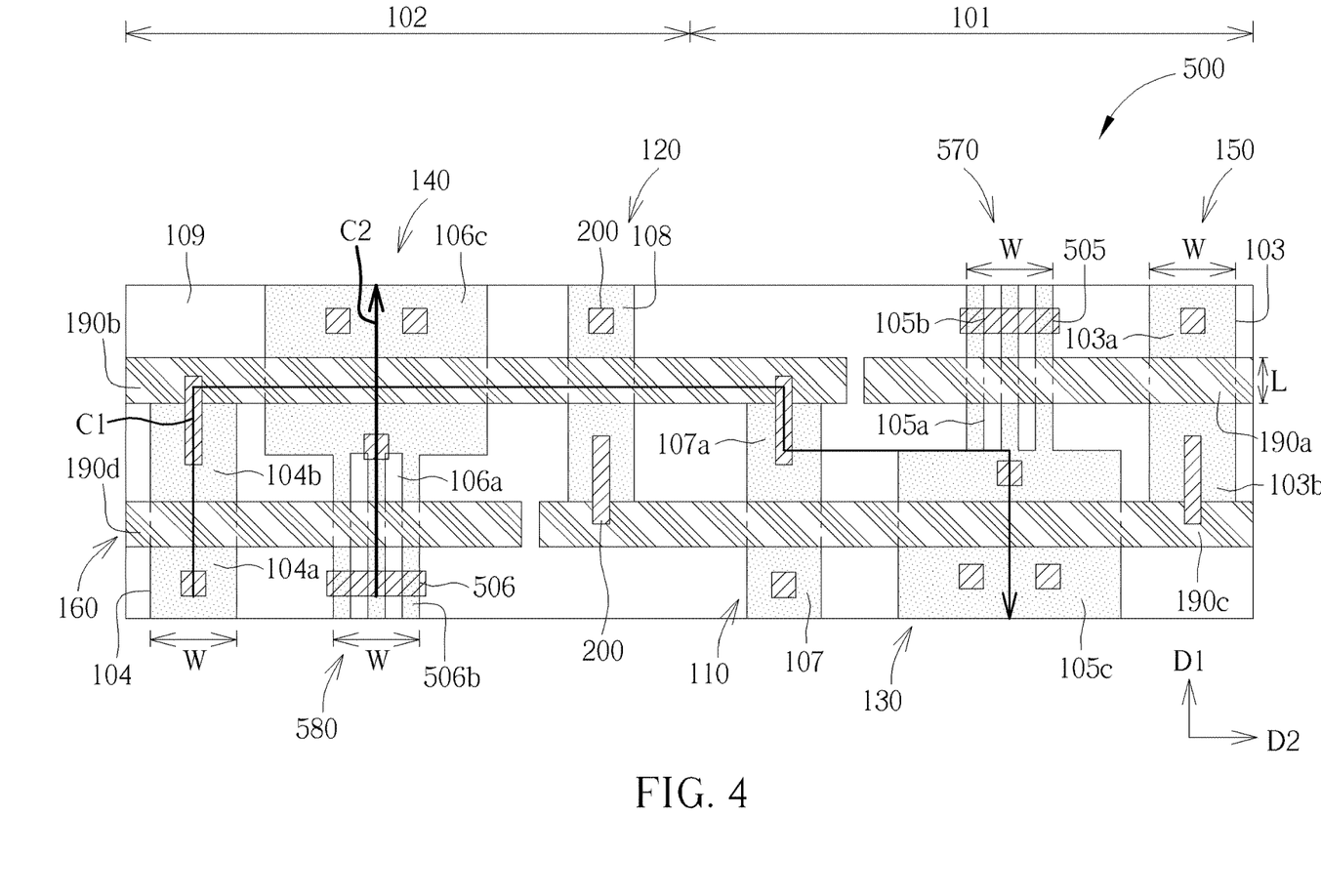
FIG. 4 shows another layout of a semiconductor memory device.
Figure 5:
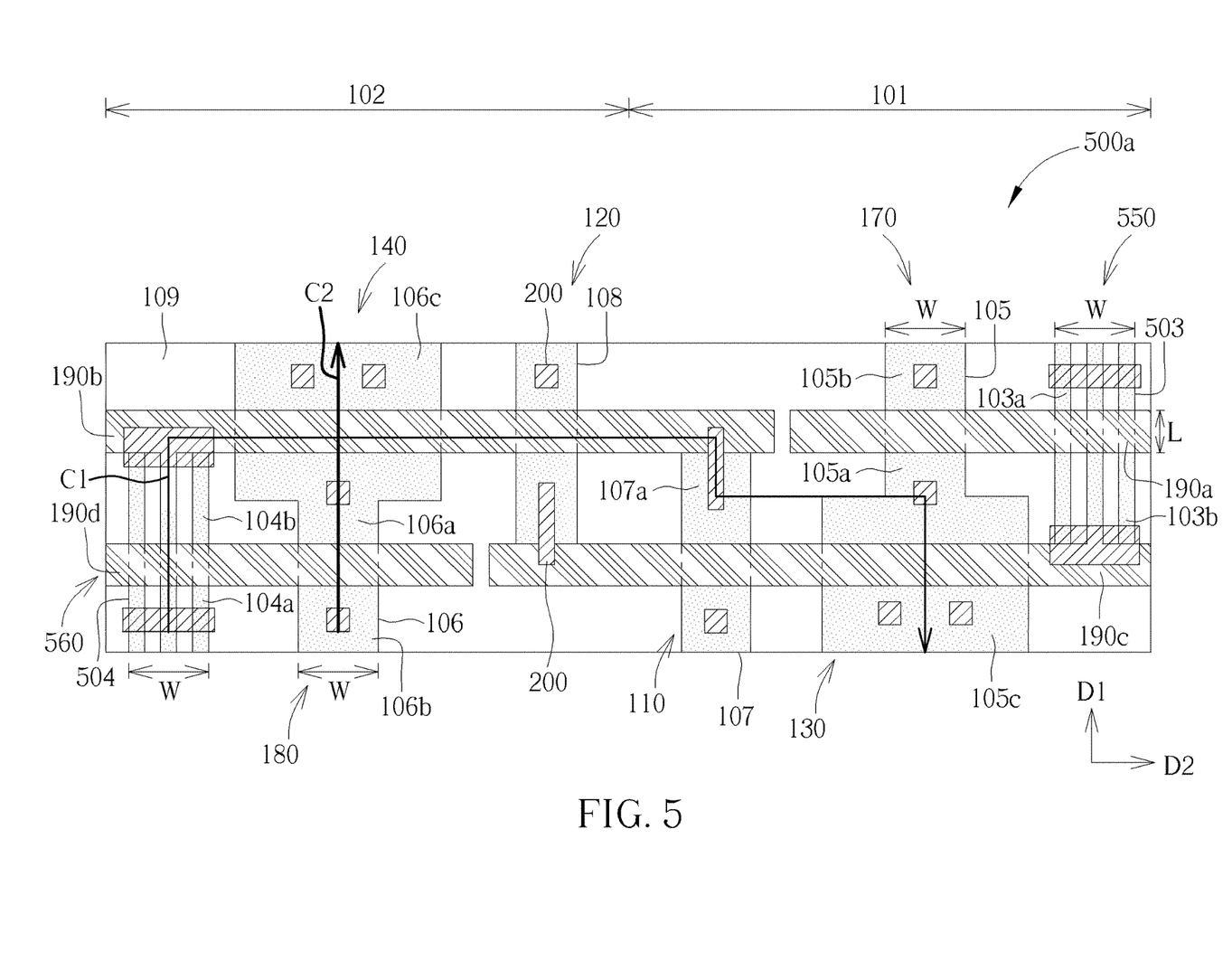
FIG. 5 shows the other layout of a semiconductor memory device.
Figure 6:
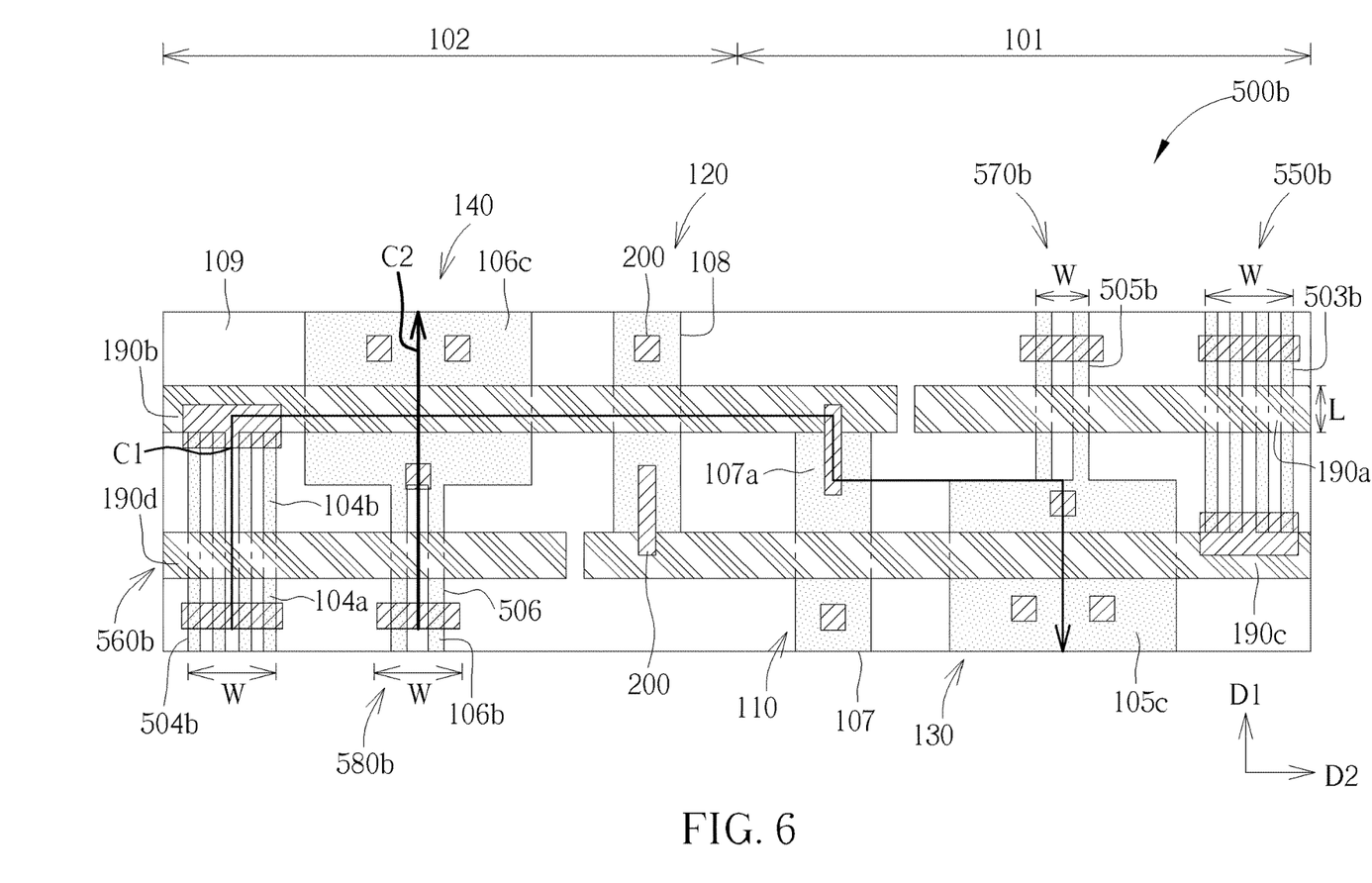
FIG. 6 shows the other layout of a semiconductor memory device.

However, people in the arts shall fully understand that, although the aforementioned asymmetric first outer PG transistor 450 and first inner PG transistor 470, and/or the asymmetric second outer PG transistor 460 and second inner PG transistor 480 are accomplished by changing the widths of the active areas 403-406 on the planar substrate, the present embodiment is not limited thereto, and the practical layout thereof may be further adjustable according to product requirements. In another example, active areas 505, 506 where below the gate 190*a*, 190*d* may further include a comb-structure, as shown in FIG. 4. That is, the channel widths (not shown in the drawings) of the first inner PG transistor 570 and the second inner PG transistor 580 may be reduced, in comparison with the channel widths W of the first embodiment. Also, in another example, active areas 503, 504 where below the gate 190*a*, 190*d* may further include a plurality of fins (not shown in the drawings) respectively, as shown in FIG. 5. That is, the channel widths (not shown in the drawings) of the first outer PG transistor 550 and the second outer PG transistor 560 may be enlarged, in comparison with the channel widths W of the first embodiment. Furthermore, in another example, active areas 503*b*, 504*b*, 505*b*, 506*b* where below the gate 190*a*, 190*d* respectively may further include a plurality of fins (not shown in the drawings), and the active areas 503*b*, 504*b* include more numbers of fins than that of the active areas 505*b*, 506*b*, as shown in FIG. 6. That is, the channel widths (not shown in the drawings) of the first outer PG transistor 550*b*, the first inner PG transistor 570*b*, the second outer PG transistor 560*b*, and the second inner PG transistor 580*b* are all changed in comparison with the channel widths W of the first embodiment, and the channel widths of the first outer PG transistor 550*b* and the second outer PG transistor 560*b* are greater than the channel widths of the first inner PG transistor 570*b* and the second inner PG transistor 580*b*.

Then, each semiconductor memory device 500, 500*a*, 500*b* obtained accordingly may all have an asymmetric PG transistors layout. According to the aforementioned examples, the channel width of each first outer PG transistor is greater than the channel width of each first inner PG transistors, and/or the channel width of each second outer PG transistor is also greater than the channel width of each second inner PG transistor, so as to enhance the performance of those outer PG transistors, or reduce the performance of those inner PG transistors. Thus, the inconsistent current issue between the inner PG transistor and the outer PG transistor of the first embodiment may also be improved thereby, and the semiconductor memory device 500, 500*a*, 500*b* can achieve better performance.

Figure 7:
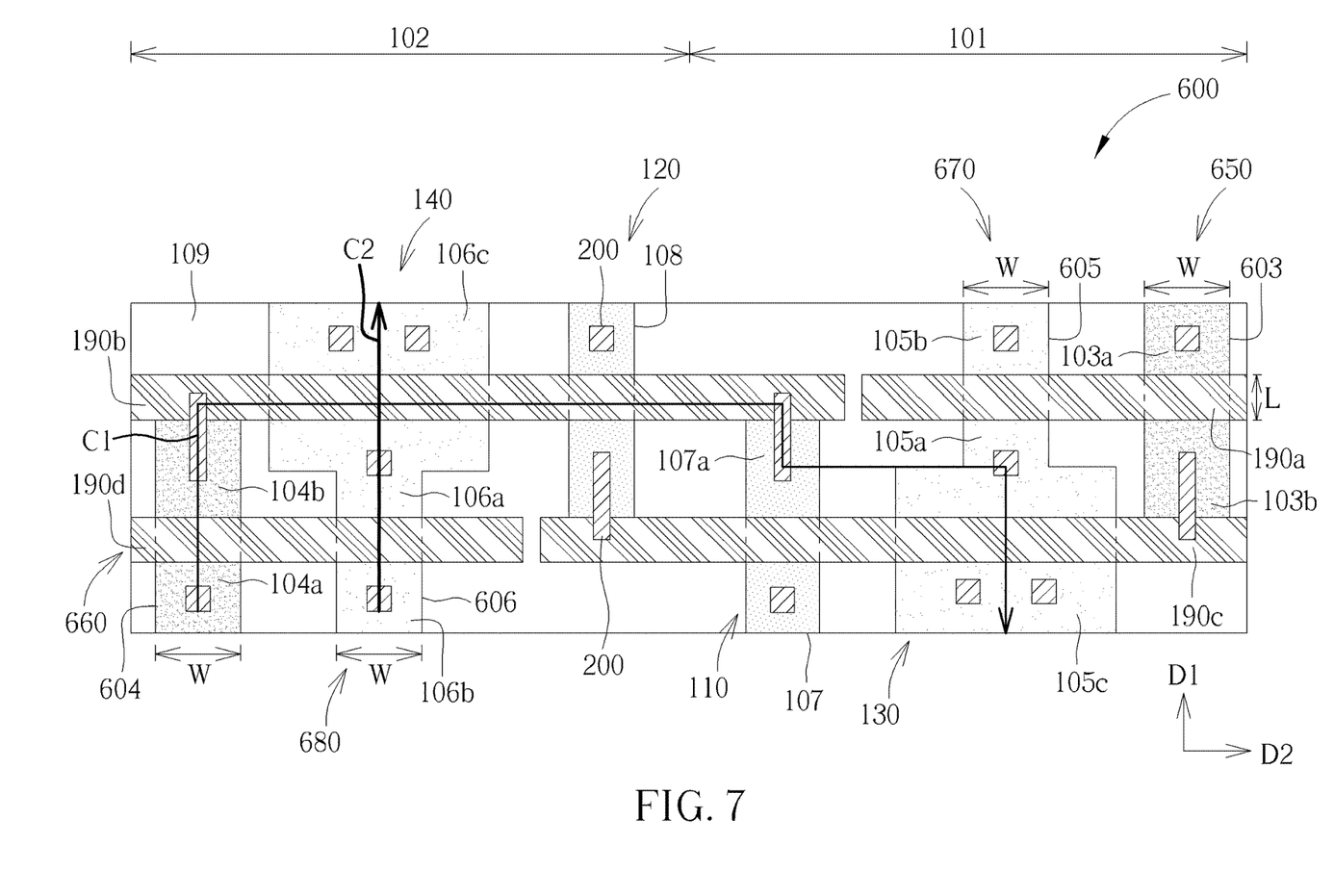
FIG. 7 shows a layout of a semiconductor memory device.
Figure 8:
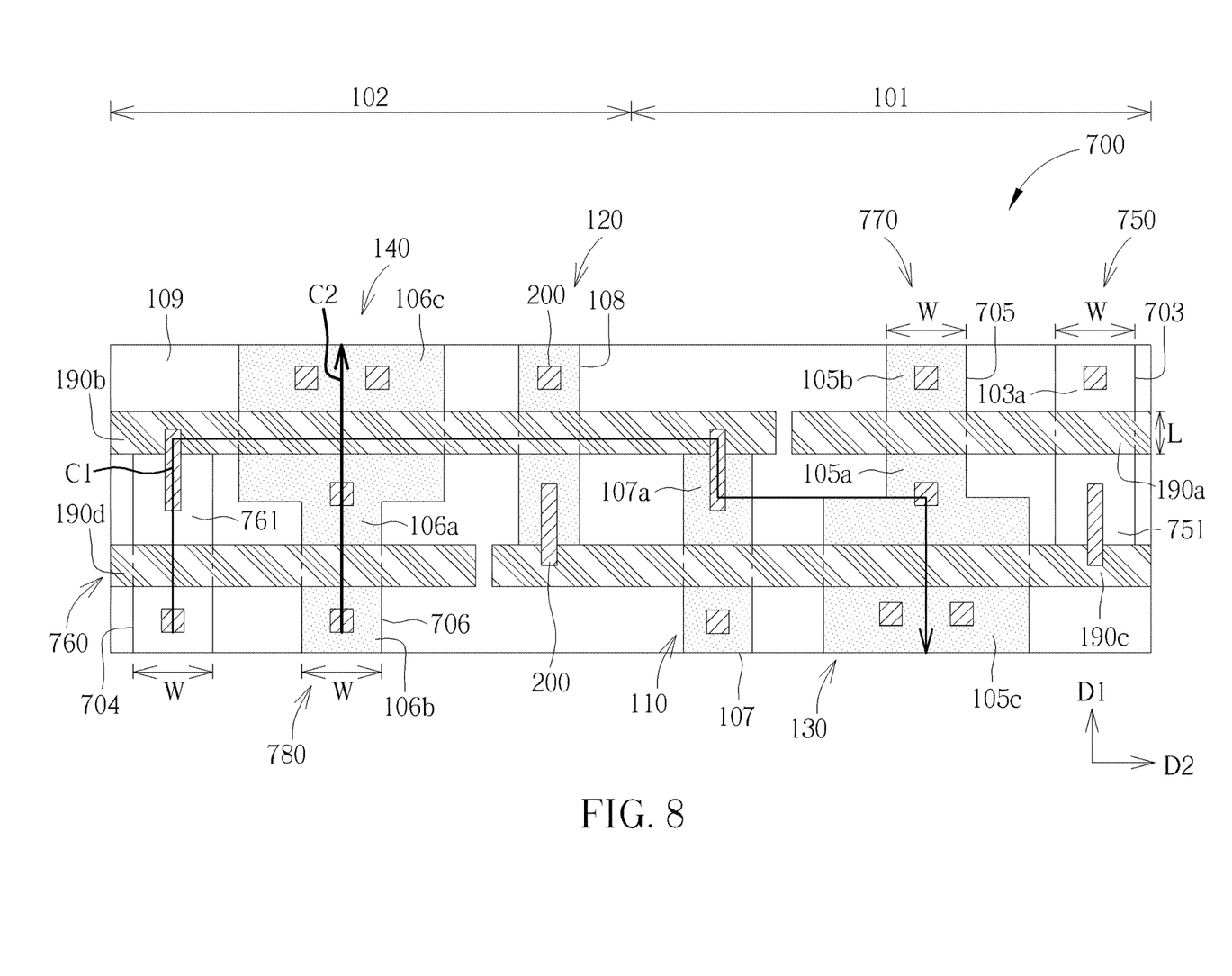
FIG. 8 shows another layout of a semiconductor memory device.
Figure 9:
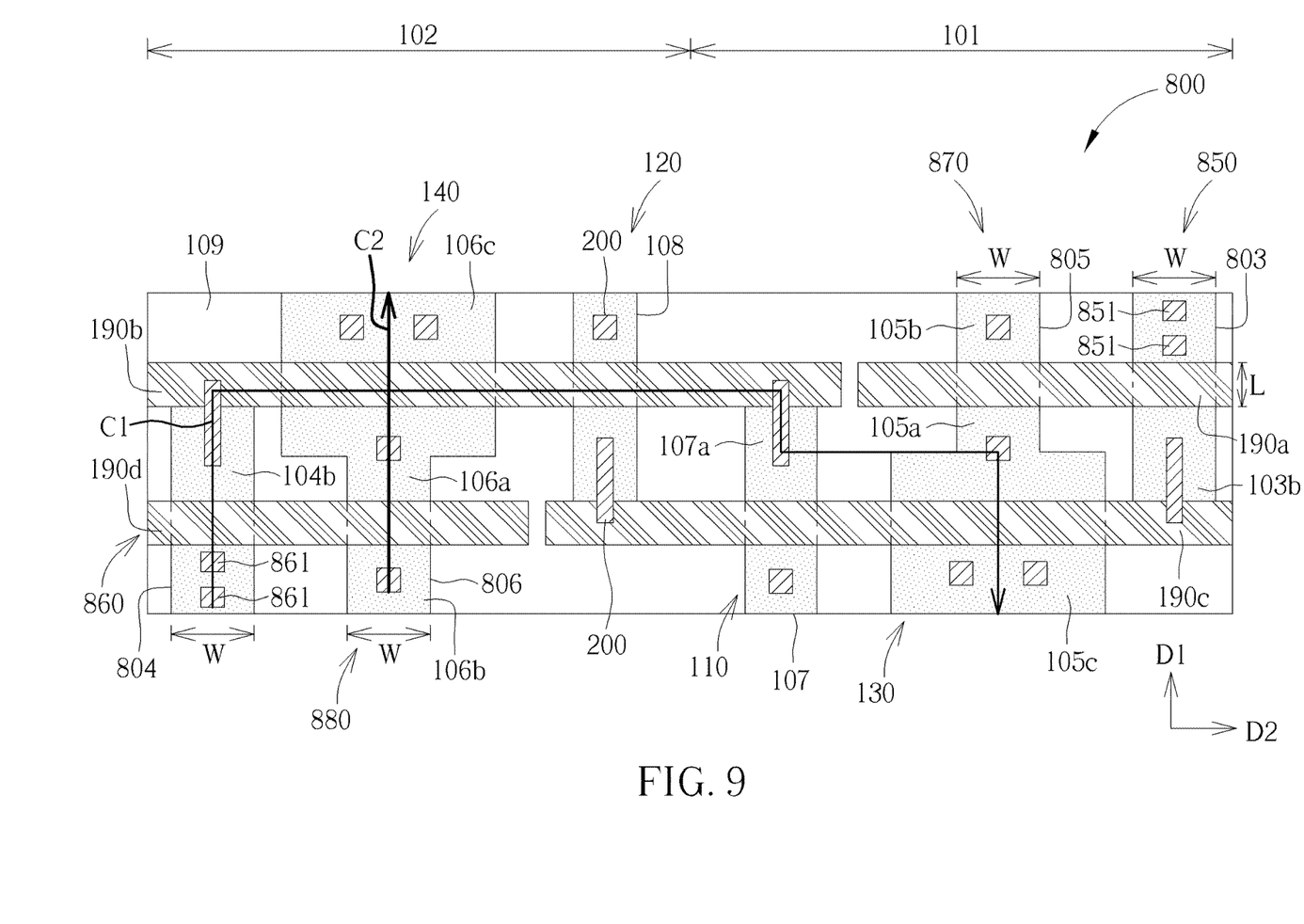
FIG. 9 shows the other layout of a semiconductor memory device.

Referring to FIGS. 7-9, a semiconductor memory device according to the third embodiment of the present invention is shown. The layout of the semiconductor memory device in the present embodiment is substantially similar to that in aforementioned first embodiment, and which includes four gates across six active areas to define eight transistors to serve as a cell of 8T-SRAM device. The difference between the present embodiment and the aforementioned first and second preferred embodiments is in that, the resistances of the outer PG transistor 650/660 and the inner PG transistor 670/680 are different from each other.

Precisely, an ion implantation process is further performed, to implant suitable dopant into the active areas 603, 604, 605, 606, with the implanted dopant for example including phosphorus (P) or the arsenic (As), but not limited thereto. Preferably, a doped dosage (doped concentration) implanted in the active areas 603, 604 is greater than a doped dosage implanted in the active areas 605, 606, as shown FIG. 7. Otherwise, different dopants are respectively implanted into the active areas 603, 604, and the active areas 605, 606, with phosphorus being implanted into the active areas 603, 604 and with arsenic being implanted into the active areas 605, 606 respectively, for example, but not limited thereto. That is, the threshold voltages of the outer PG transistor 650/660 and the inner PG transistor 670/680 may be changed, so as to enhance the performances of the outer PG transistors 650, 660, or to decrease the performance of the inner PG transistors 670, 680. In this way, the current passed through the current path C1 may therefore be increased, or the current passed through the current path C2 may therefore be decreased, so that, the inconsistent current issue between the inner PG transistor and the outer PG transistor in the first embodiment can be improved. The semiconductor memory device 600 of the present embodiment can also achieve better performance and quality.

However, people in the arts shall fully understand that, the resistances of the PG transistors are not limited to be changed by performing different implanted dosages or different dopants, and the practical layout may be further adjustable according to product requirements. For example, a silicide layer 751, 761 may be formed additionally on the surfaces of the active areas 703, 704 below the gates 190*a*, 190*d*, to further adjust the threshold voltage of the outer PG transistors 750, 760, as shown in FIG. 8. That is, the performance of the outer PG transistors 750, 760 may be enhanced, or the performance of the inner PG transistors 770 may be reduced, so as to enhance the current through the current path C1, or to reduce the current through the current path C2. Also, in another example, more plugs 851, 861 are further disposed to electrically connect the outer PG transistor 850, 860, as shown in FIG. 9, to further adjust the threshold voltage of each transistor. That is the performance of the outer PG transistors 850, 860 may be enhanced, or the performance of the inner PG transistors 870, 880 may be reduced, so as to enhance the current through the current path C1, or to reduce the current through the current path C2 may be decreased.

Overall speaking, a semiconductor memory device provided in the present invention includes a symmetric layout having at least two asymmetric PG transistors, so as to reduce the inconsistent Iread and SNM between different regions. Through the present invention, the performance of an outer PG transistor is enhanced, and/or the performance of an inner transistor is reduced, either through changing the channel widths, the resistances or the threshold voltages thereof, so that, the currents passed through the outer PG transistor and the inner PG transistor may be enhance and/or reduced accordingly. In this way, the current differences in different regions can be decreased and the quality of semiconductor memory device can be improved thereby.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
    a first inverter, comprising a first pull-up transistor and a first pull-down transistor;
    a second inverter, comprising a second pull-up transistor and a second pull-down transistor, wherein the first inverter and the second inverter forms a latch circuit;
    a first inner access transistor and a first outer access transistor, electrically connected to the latch circuit and a first word line; and
    a second inner access transistor and a second outer access transistor, electrically connected to the latch circuit and a second word line, wherein the second inner access transistor comprises a first channel width which is different from a second channel width of the second outer access transistor, wherein the second inner access transistor comprises a gate across a first active area, the second outer access transistor comprises the gate across a second active area, and a width of the second active area is relative greater than a width of the first active area in a first direction.

2. The layout of a semiconductor memory device of claim 1, wherein the first active area and the second active are both disposed on a planar substrate.

3. The layout of a semiconductor memory device of claim 1, wherein the first active area is disposed on a planar substrate and the second active area is disposed on a plurality of fins.

4. The layout of a semiconductor memory device of claim 1, wherein the first active area and the second active area are both disposed on a plurality of fins, and the second active area includes more number of fins than that of the first active area.

5. The layout of a semiconductor memory device of claim 1, wherein a resistance of the second inner access transistor is greater than a resistance of the second outer access transistor.

6. The layout of a semiconductor memory device of claim 1, wherein a doped concentration of the first active area is different than a doped concentration of the second active area.

7. The layout of a semiconductor memory device of claim 6, wherein the doped concentration of the second active area is greater than the doped concentration of the first active area.

8. The layout of a semiconductor memory device of claim 1, wherein dopants implanted in the first active area and the second active area are different.

9. The layout of a semiconductor memory device of claim 1, further comprising:
    a plurality of plugs electrically connected to the first active area and the second active area respectively, wherein a number of the plugs electrically connected to the second active area is greater than a number of the plugs electrically connected to the first active area.

10. The layout of a semiconductor memory device of claim 1, further comprising:
    a silicide layer disposed on the second active area.

11. The layout of a semiconductor memory device of claim 1, wherein the first inner access transistor and the first outer access transistor respectively connected to a first bit line and a second bit line.

12. The layout of a semiconductor memory device of claim 1, wherein the second inner access transistor and the second outer access transistor respectively connected to a third bit line and a fourth bit line.

13. The layout of a semiconductor memory device of claim 1, wherein the first inner access transistor comprises another gate across a third active area, the first outer access transistor comprises the another gate across a fourth active area, and the another gate and the gate are both extended along the first direction.

14. The layout of a semiconductor memory device of claim 13, wherein a width of the third active area is different from a width of the fourth active area in the first direction.

15. The layout of a semiconductor memory device of claim 13, wherein a width of the fourth active area is greater than a width of the third active area.

16. The layout of a semiconductor memory device of claim 1, wherein a resistance of the first inner access transistor is greater than a resistance of the first outer access transistor.

17. The layout of a semiconductor memory device of claim 13, wherein a doped concentration of the fourth active area is greater than a doped concentration of the third active area.

18. The layout of a semiconductor memory device of claim 13, wherein dopants implanted in the third active area and the fourth active area are different.

* * * * *